(12) United States Patent
Neukam

(10) Patent No.: US 8,905,769 B2
(45) Date of Patent: Dec. 9, 2014

(54) HOUSING FOR A COMPUTER SYSTEM AND A COMPUTER SYSTEM WITH SUCH A HOUSING

(71) Applicant: Fujitsu Technology Solutions Intellectual Property GmbH, München (DE)

(72) Inventor: Wilhelm Neukam, Bobingen (DE)

(73) Assignee: Fujitsu Technology Solutions Intellectual Property GmbH (DE)

( * ) Notice: Subject to any disclaimer, the term of this patent is extended or adjusted under 35 U.S.C. 154(b) by 45 days.

(21) Appl. No.: 13/732,508

(22) Filed: Jan. 2, 2013

(65) Prior Publication Data
US 2013/0171851 A1  Jul. 4, 2013

(30) Foreign Application Priority Data
Jan. 4, 2012 (DE) .......... 10 2012 100 056

(51) Int. Cl.
*H01R 13/44* (2006.01)
*H05K 5/00* (2006.01)
*G06F 1/18* (2006.01)
*H01R 13/453* (2006.01)
*H01R 13/639* (2006.01)
*H05K 5/02* (2006.01)

(52) U.S. Cl.
CPC *H05K 5/00* (2013.01); *G06F 1/181* (2013.01); *H01R 13/4534* (2013.01); *H01R 13/4536* (2013.01); *H01R 13/6395* (2013.01); *H05K 5/0208* (2013.01); *Y10S 439/911* (2013.01)
USPC .......................... 439/137; 439/911

(58) Field of Classification Search
USPC .......................... 439/135, 137, 911
See application file for complete search history.

(56) References Cited

U.S. PATENT DOCUMENTS

| 6,038,125 A | * | 3/2000 | Anzai ............... 361/609 |
| 6,549,397 B1 | | 4/2003 | Diaz et al. |
| 7,207,812 B1 | | 4/2007 | Wong |
| 7,264,489 B2 | * | 9/2007 | Higham et al. ....... 439/137 |
| 2011/0304972 A1 | | 12/2011 | Goh et al. |
| 2013/0171851 A1 | * | 7/2013 | Neukam .............. 439/215 |

FOREIGN PATENT DOCUMENTS

| DE | 94 04 326.4 | 6/1994 |
| DE | 298 16 033 U1 | 1/1999 |
| DE | 10 2009 019 517 A1 | 12/2010 |

OTHER PUBLICATIONS

Office Action dated Sep. 25, 2014 from related U.S. Appl. No. 13/733,387.

* cited by examiner

*Primary Examiner* — James Harvey
(74) *Attorney, Agent, or Firm* — DLA Piper LLP (US)

(57) ABSTRACT

A housing for a computer system which can be opened at at least one first housing wall for access into the housing and an opening for an external connecting plug is disposed at a second housing wall and where 1) the housing has a locking device to lock the first housing wall and prevent opening of the housing, the locking device is disposed at the opening for an external connecting plug and is actuatable via an external connecting plug so that the first housing wall is locked when an external connecting plug is inserted into the opening and the first housing wall is unlocked if no external connecting plug is inserted into the opening.

14 Claims, 3 Drawing Sheets

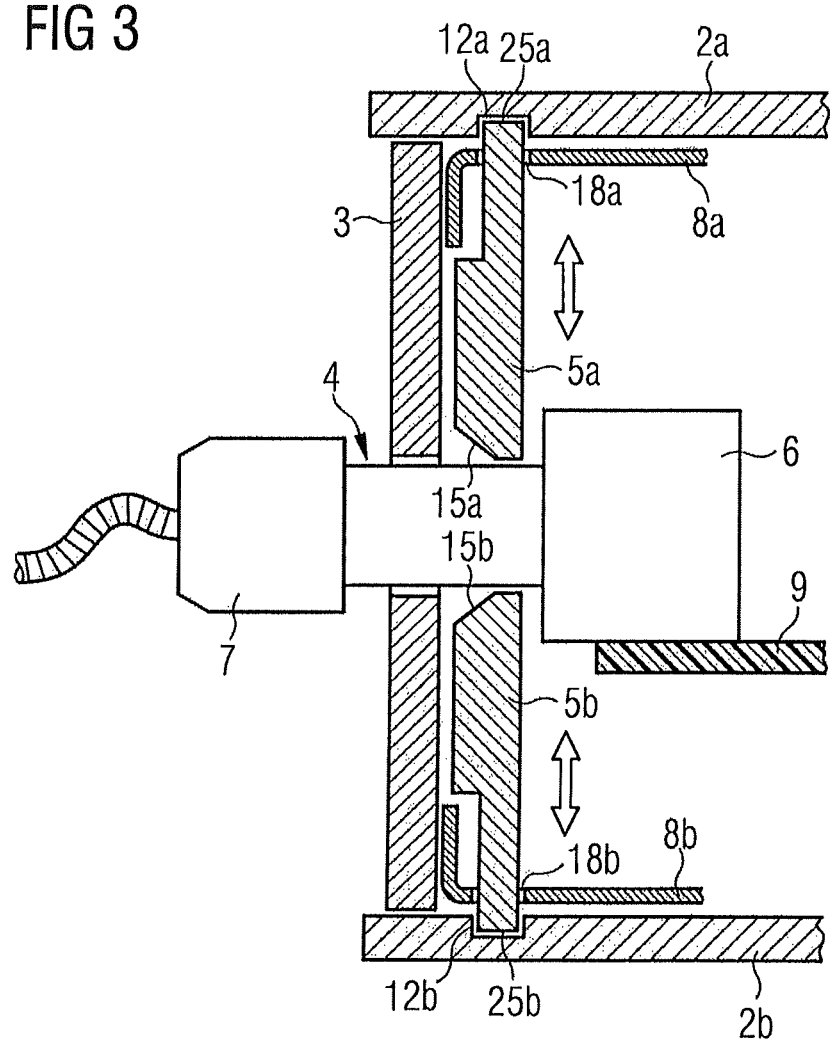

HOUSING FOR A COMPUTER SYSTEM AND A COMPUTER SYSTEM WITH SUCH A HOUSING

RELATED APPLICATION

This application claims priority of German Patent Application No. 10 2012 100 056.5, filed Jan. 4, 2012, the subject matter of which is incorporated herein by reference.

TECHNICAL FIELD

This device relates to a housing for a computer system, where the housing can be opened at at least one first housing wall for access into the housing and an opening for an external connecting plug is disposed at a second housing wall and where the housing has a locking device for locking the first housing wall to prevent opening of the housing.

The disclosure also relates to a computer system with such a housing.

BACKGROUND

Computer systems have electronic components that are current conducting and/or on which an electric voltage is present. When a housing of a computer system is opened, there is, with improper operation, the danger of an electric shock (so-called "power hazard" or danger of an electric accident). Improper operation is given, for example, by the fact that the computer system is connected to an external current or voltage source via an external connecting plug when the housing is open. This can take place, for example, via a current supplying unit (like a power supply) connected to the supply network (power grid).

High (input) voltages are present in electronic components in the housing, in particular in computer systems in which the power supply for converting the grid-side alternating voltage to a supply voltage is disposed within the housing of the computer system.

It could nonetheless be helpful to provide a safer computer system with respect to improper operation so that the power hazard for a user is considerably reduced or prevented.

SUMMARY

I provide a housing for a computer system which can be opened at at least one first housing wall for access into the housing and an opening for an external connecting plug is disposed at a second housing wall and where 1) the housing has a locking device to lock the first housing wall and prevent opening of the housing, and 2) the locking device is disposed at the opening for an external connecting plug and is actuatable via an external connecting plug so that the first housing wall is locked when an external connecting plug is inserted into the opening and the first housing wall is unlocked if no external connecting plug is inserted into the opening.

I also provide a computer system including the housing, at least one system board and, behind an opening at the second housing wall, a power supply connector for electric interaction with the external connecting plug.

BRIEF DESCRIPTION OF THE DRAWINGS

FIG. 3 shows a sectional view of an arrangement of an external connecting plug with a part of a housing.

REFERENCE NUMBERS

Figure 1:
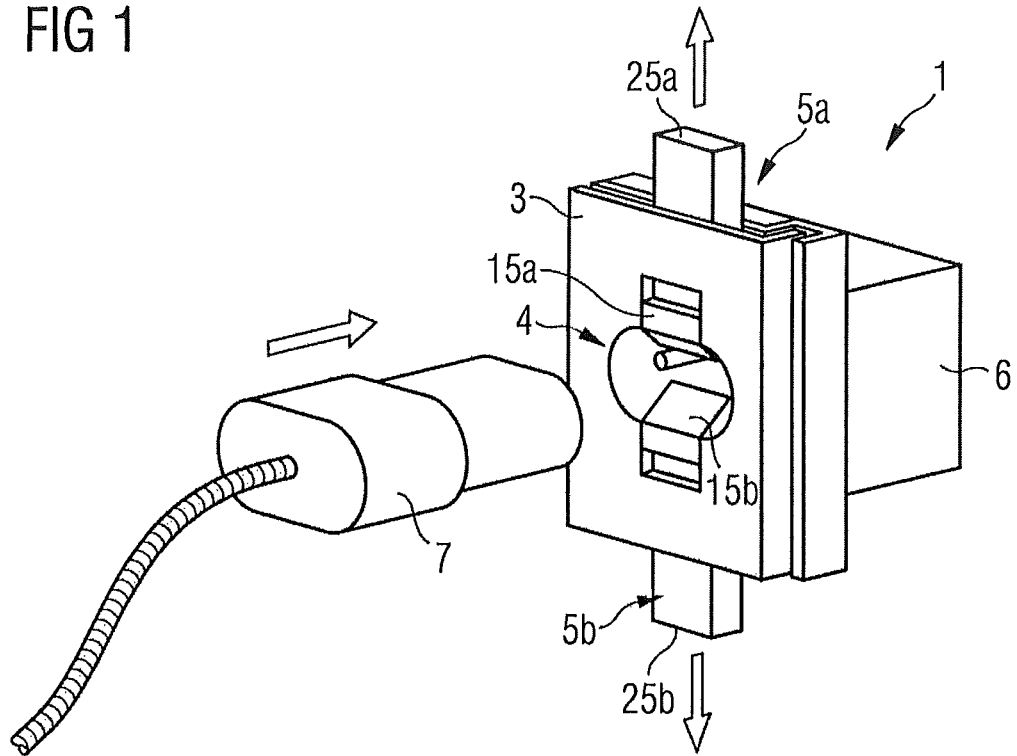
FIG. 1 shows a perspective view of an arrangement with an external connecting plug and a part of a housing of a computer system in a first state.

1 Housing
2a, 2b Housing panel
3 Housing side wall
4 Opening for external connecting plug
5a, 5b Bolts
6 Power supply connector
7 Connecting plug
8a, 8b Bracket
9 System board
12a, 12b Groove in housing panel
13 Groove in housing side wall
15a, 15b First end of bolt
18a, 18b Passage in bracket
25a, 25b Second end of bolt

DETAILED DESCRIPTION

It will be appreciated that the following description is intended to refer to specific examples of structure selected for illustration in the drawings and is not intended to define or limit the disclosure, other than in the appended claims.

I provide a housing wherein the locking device is disposed at an opening for an external connecting plug and is actuatable via an external connecting plug so that the first housing wall is locked when an external connecting plug is inserted into the opening, and the first housing wall is unlocked when no external connecting plug is inserted into the opening.

Such a housing can be opened at the first housing wall only when no external connecting plug has been inserted into the opening at the second housing wall. Access to the inside of the housing can thus be prevented when an external connecting plug is plugged in and, for example, electronic components within the housing are supplied with electric power from outside. Only when the external connecting plug has been pulled out the locking device, does release the first housing wall so that it can be opened. In this way the danger of an electric shock from current-conducting components or components on which an electric voltage is present in the housing interior becomes considerably reduced or prevented.

The locking device is disposed at the opening for the external connecting plug and at the same time is coupled to the first housing wall so that the locking device locks the first housing wall as long as an external connecting plug is inserted into the opening.

The terms "first" and "second" housing wall describe different housing walls of a housing. This means that the first housing wall, for example, extends over a first surface and the second housing wall extends over a second surface. The two surfaces are not made parallel to each other. In the simplest case, the first housing wall can be designed to be almost perpendicular to the second housing wall. For example, the first housing wall can be a side wall of a housing, and the second housing wall can be a rear wall of a housing.

A housing of this kind thus avoids improper operation, which can consist of a computer system housed by the housing being connected to the power grid even though the housing is open and electronic components that conduct current and/or at which an electric voltage is present are accessible for a user. Thus, the danger of an electric shock is considerably reduced or even prevented by the housing.

Such a housing is especially advantageous for computer systems in which the power supply unit, i.e., the power supply, is integrated into the housing. The power supply unit can be permanently integrated into the housing so that it is not removable.

The locking device may comprise at least one bolt which can be moved between a first position and a second position, where the bolt is not engaged with the first housing wall in the first position and is engaged with the first housing wall in the second position.

The bolt itself may mechanically interact with an external connecting plug. Alternatively, at least one coupling element may be provided between an external connecting plug and the bolt for positive coupling of an external connecting plug to the bolt.

The bolt may be spring mounted via a flexible element. The bolt is in the first position when the flexible element is relaxed, i.e., not under tension and can be brought from the first position into the second position against a force of the flexible element. The flexible element can be any kind of springy element. The advantage of coupling the bolt to a flexible element lies in the fact that the bolt automatically moves into the first position and is held there when an external connecting plug is withdrawn from the opening of the housing. Only if there is a mechanical interaction between an external connecting plug and the locking device, a coupling device or directly with the bolt the bolt is brought into the second position against the force of the flexible element and held there.

As soon as an external connecting plug is removed from the opening, the bolt is forced from the second position back into the first position by the force of the flexible element. This ensures that the housing is automatically unlocked when the external connecting plug is removed. An additional operation for unlocking is not necessary.

The direction of motion of the bolt from the first position to the second position may be a rotary motion. This means that the bolt can swivel between the first and the second position relative to an insertion motion of the external connecting plug.

Alternatively, the direction of motion of the bolt may be linearly inclined to the direction of motion of an external connecting plug inserted into the opening. "Linearly inclined" means that the direction of motion of the bolt is not parallel to the direction of motion of the external connecting plug. In particular, the direction of motion of the bolt can be virtually perpendicular to the direction of motion of an external connecting plug. In both examples with alternative motions of the bolt, the motion of insertion of an external connecting plug is converted to an actuating motion of the bolt to lock or unlock the first housing wall.

A computer system may be designed with a housing of the kind as described above where at least one system board of the computer system and, behind the opening in the second housing wall of the housing, a power supply connector for electric interaction with an external connecting plug are disposed in the housing.

The computer system may comprise a power supply unit, i.e., a power supply disposed in the housing of the computer system, for example, on the system board. The power supply unit can be fixedly mounted in the housing of the computer system so that the power supply unit is not removable. To supply the computer system with electric power, an external connecting plug can be inserted through the opening of the housing and connected with the power supply connector in the housing so that electric power can be supplied to the computer system from outside.

In particular in the case of a power supply unit integrated in the housing, A. C. voltage from the power grid, e.g., 230 VAC, can be supplied to the computer system from outside. It is advantageous, in particular in the last case, to be able to open the housing of the computer system at the first housing wall only when the external connecting plug of the power grid has been pulled from the housing. Thus, the danger of an electric shock for operating or service personnel for the computer system is considerably reduced.

The computer system may be a thin client, an all-in-one PC or a mini PC.

Other advantages are disclosed in the following description of the Drawings. The subject-matter is further explained by reference to the Drawings.

FIG. 1 shows an arrangement with an external connecting plug 7 and a part of a housing 1. In FIG. 1, the external connecting plug 7 is not connected to the housing 1.

The housing 1 has a housing side wall 3 with an opening 4 for the external connecting plug 7. A power supply connector 6 for electric interaction with the connecting plug 7 is furnished in the interior of the housing behind the opening 4. The housing 1 can, for example, form a housing of a computer system (for example, a thin client, all-in-one PC or mini PC), which is supplied with electric power via the external connecting plug 7.

In addition, the housing 1 comprises a locking device with two bolts 5a and 5b. Bolts 5a and 5b are disposed so that they are movable almost perpendicularly to a direction of motion of the external connecting plug 7 (see arrows). In particular, the bolt 5a can be moved from a first position shown in FIG. 1 upwardly in the direction of the arrow into a second position. The bolt 5b can be moved from the first position shown in FIG. 1 downwardly in the direction of the arrow into a second position. Each of bolts 5a and 5b has a first end 15a and 15b, respectively, which in the first position as in FIG. 1 project into the opening 4 for the external connecting plug. This means that the first ends 15a and 15b plunge into the opening 4 so that they can interact mechanically with the connecting plug 7. The second ends 25a and 25b of bolts 5a and 5b project beyond the housing side wall 3 and serve to lock additional housing walls, as explained below.

The first ends 15a and 15b of the bolts 5a and 5b in the example in FIG. 1 are provided with angled faces which force the two bolts 5a and 5b in their relevant direction of motion (see arrows) into the second position upon contact with the connecting plug 7. This means that when the connecting plug 7 is inserted into the opening 4 at the housing side wall 3, the bolts 5a and 5b are pressed upwardly or downwardly, respectively, via the angled faces 15a and 15b.

Figure 2:
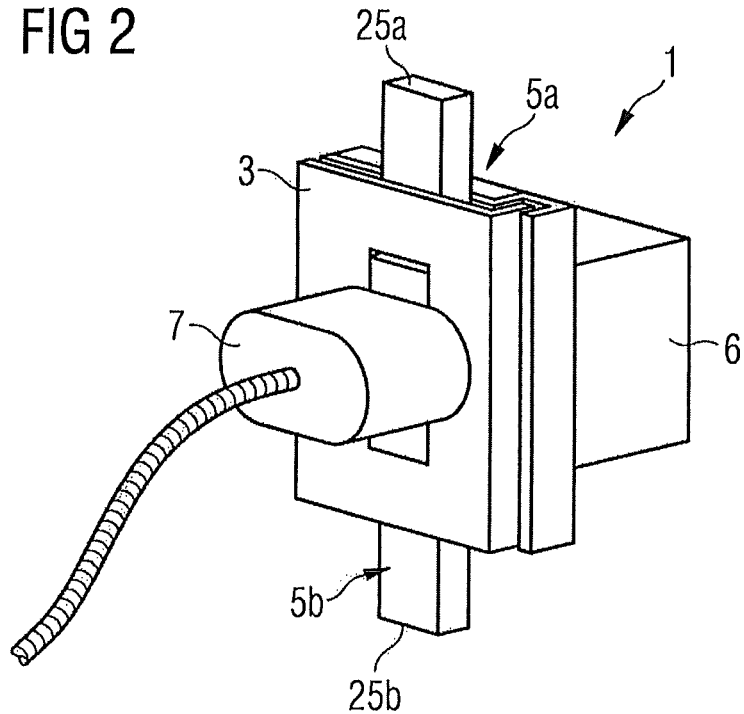
FIG. 2 shows the arrangement of FIG. 1 in a second state.

FIG. 2 shows the arrangement of FIG. 1, where the connecting plug 7 has been inserted into the opening 4 (see FIG. 1) and the two bolts 5a and 5b have been moved as explained above. This means that bolts 5a and 5b are now in a second position which differs from the position in FIG. 1. In particular, the second ends 25a and 25b of bolts 5a and 5b have been moved upwardly or downwardly, respectively. In the position shown in FIG. 2, the ends 25a and 25b serve to lock housing panels or housing walls, as explained below.

FIG. 3 shows a sectional view of an arrangement with a connecting plug 7 inserted into the housing 1 through an opening 4 in a housing side wall 3.

In particular, the connecting plug 7 is connected to the power supply connector 6 in the interior of housing 1, where the power supply connector 6 is mounted on a system board 9.

The bolts 5a and 5b were moved from a first position (see FIG. 1) into the second position shown in FIG. 3 (see also FIG. 2) by connecting plug 7 via angled faces at the first ends 15a and 15b as explained above. In FIG. 3 the second ends 25a and 25b of bolts 5a and 5b each plunge through apertures 18a and 18b in brackets 8a and 8b of housing 1. In addition, the second ends 25a and 25b plunge into grooves 12a and 12b of housing panels 2a and 2b of the housing 1.

In the design in FIG. 3, the bolts 5a and 5b thus perform a double locking function. A first locking results from the fact that the ends 25a and 25b slip through the brackets 8a and 8b. The brackets 8a and 8b serve to lock the housing interior and can, for example, be solidly screwed to the housing side wall 3. The housing 1 is thus protected against access into the housing interior by brackets 8a and 8b.

An additional locking function results from the slipping of the second ends 25a and 25b into grooves 12a and 12b of the outer housing panels 2a and 2b. The housing panels 2a and 2b, for example, serve for external aesthetic enclosure of housing 1 and, for example, form plastic design covers. The housing panels 2a and 2b can, however, also carry out the safety tasks of an external housing covering and a housing enclosure.

The housing panels 2a and 2b cannot be opened or removed due to locking of both the brackets 8a and 8b and the panels 2a and 2b themselves through the locking shown in FIG. 3. The housing 1 is thus locked in the form shown in FIG. 3 so that the housing walls 2a and 2b and 8a and 8b cannot be opened. Access into the housing interior is thus not possible if the connecting plug 7 is plugged in. In particular, access to current-carrying components in the housing interior is prevented when electronic components, for example, the system board 9 are supplied in the interior of housing 1 with alternating voltage from the power grid via connecting plug 7.

Only when the connecting plug 7 is pulled out and an electric connection to the power supply connector 6 is disconnected bolts 5a and 5b move back to an original position (see FIG. 1), for example, with the help of flexible elements (not shown) so that locking of the housing panels 2a and 2b or the brackets 8a and 8b is cancelled. The housing panels 2a and 2b can then be, for example, shifted horizontally and removed from housing 1. The brackets 8a and 8b can be separated from the housing side wall 3 and removed, for example, toward the top or toward the bottom so that the housing interior is opened.

Figure 4A:
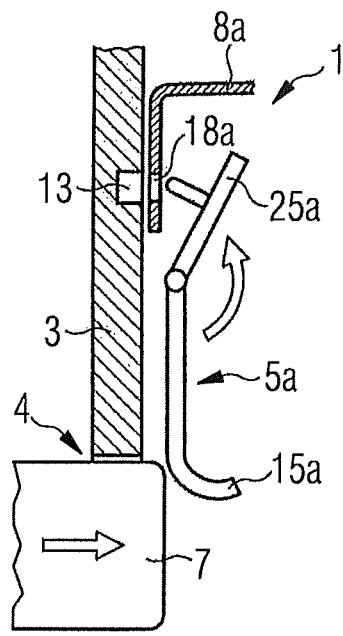
FIG. 4A shows a sectional view of an arrangement of a connecting plug with a part of a housing in an alternative example in a first state.

FIG. 4A shows another example of locking of a bracket 8a on housing 1 via a locking device, which likewise comprises a bolt 5a. In contrast to the preceding examples, the bolt 5a in FIG. 4A is not translationally movable, but rather rotationally movable. This means that bolt 5a can be swiveled about a predetermined axis of rotation. The bolt 5a has a first end 15a with an angled face and a second end 25a with a locking pin or tooth. The locking pin is designed to slip through an aperture 18a in bracket 8a into a groove 13 in the housing side wall 3 and in this way to lock the bracket 8a.

Similar to the examples in FIGS. 1-3, the bolt 5a in FIG. 4A can also be operated via a connecting plug 7, which can be inserted into the opening 4 in the housing side wall 3. In FIG. 4A, the connecting plug 7 is only partly inserted into the housing 1 and does not yet interact with the bolt 5a. Thus, the bolt 5a is held in a first position, optionally with the assistance of a flexible element (not shown). In this first position, the bracket 8a can still be freely moved and aligned at housing 1.

Figure 4B:
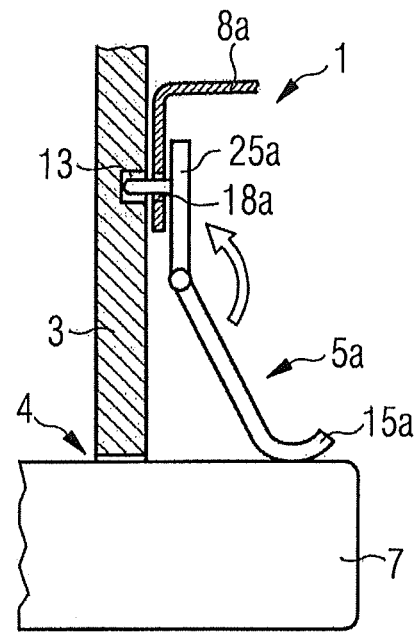
FIG. 4B shows the arrangement of FIG. 4A in a second state.

In FIG. 4B, the connecting plug 7 is completely inserted into the housing 1 and the bolt 5a actuated at the first end 15a via the angled face so that bolt 5a is swiveled into a second position. In the second position the second end 25a of the bolt 5a with its locking pin slips through the aperture 18a in bracket 8a and slips into the groove 13 in the housing side wall 3. The bracket 8a is locked and can no longer be removed from housing 1. FIG. 4B represents a state in which the connecting plug 7 electrically interacts with a power supply connector in the housing interior (see FIG. 3).

Figure 4C:
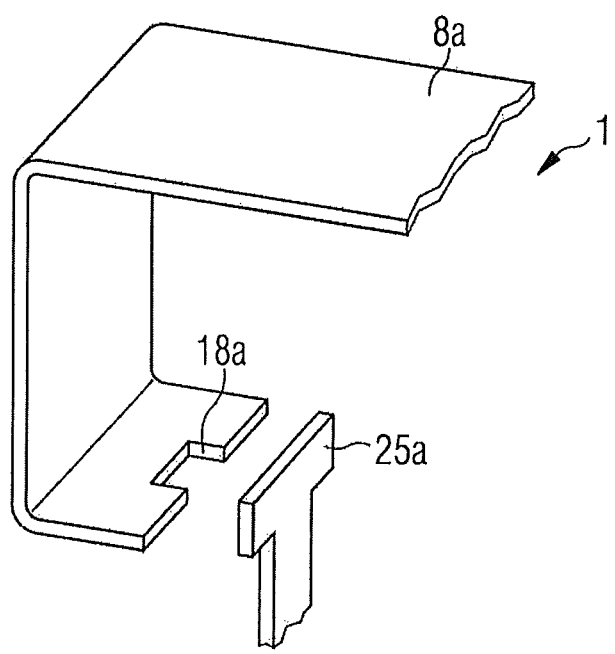
FIG. 4C shows an alternative example of components of a housing.

Another alternative of locking of a bracket 8a of housing 1 is schematically shown in FIG. 4C. In this case, locking is produced in that a first end 25a of a bolt 5a (see FIGS. 4A and 4B) is made hook-shaped and can engage in a groove or a passage 18a in bracket 8a. The bracket 8a can as an example be also locked in the manner shown in FIGS. 4A and 4B.

A locking device of the kind has the advantage that a housing of a computer system can only be opened when an electric connecting plug has been pulled out. This prevents electric power from being supplied to electronic components in the housing interior when the housing is opened. Thus, the danger of electric shock is considerably reduced or prevented.

In examples not shown, the locking device can be alternatively actuatable by different connecting plugs. The locking device may automatically lock the housing when at least one of the plurality of connecting plugs has been plugged in and only releases the housing when all of the connecting plugs have been pulled out.

Although the apparatus and methods have been described in connection with specific forms thereof, it will be appreciated that a wide variety of equivalents may be substituted for the specified elements described herein without departing from the spirit and scope of this disclosure as described in the appended claims.

The invention claimed is:

1. A housing for a computer system which can be opened at at least one first housing wall for access into the housing and an opening for an external connecting plug is disposed at a second housing wall and where 1) the housing has a locking device to lock the first housing wall and prevent opening of the housing, and 2) the locking device is disposed at the opening for an external connecting plug and is actuatable via an external connecting plug so that the first housing wall is locked when the external connecting plug is inserted into the opening and the first housing wall is unlocked if no external connecting plug is inserted into the opening; the locking device further comprises at least one bolt movable between a first position and a second position, where the bolt is out of engagement with the first housing wall in the first position and is in engagement with the first housing wall in the second position; the bolt is spring mounted via a flexible element and is in the first position when the flexible element is not under tension and can be brought from the first position into the second position against a force of the flexible element.

2. A computer system comprising the housing of claim 1, at least one system board and, behind the opening at the second housing wall, a power supply connector for electric interaction with the external connecting plug.

3. The computer system of claim 2, where the external connecting plug is inserted into the opening at the second housing wall and the first housing wall is locked.

4. A housing for a computer system which can be opened at at least one first housing wall for access into the housing and an opening for an external connecting plug is disposed at a second housing wall and where 1) the housing has a locking device to lock the first housing wall and prevent opening of the housing, and 2) the locking device is disposed at the opening for an external connecting plug and is actuatable via an external connecting plug so that the first housing wall is locked when an external connecting plug is inserted into the opening and the first housing wall is unlocked if no external connecting plug is inserted into the opening; the locking device further comprises at least one bolt movable between a first position and a second position, where the bolt is out of engagement with the first housing wall in the first position and is in engagement with the first housing wall in the second position; wherein in the first position the bolt projects with a first end into the opening for an external connecting plug and can be pressed into the second position upon contact with the external connecting plug.

5. The housing of claim 4, wherein the first end of the bolt has an angled face for mechanical interaction with the external connecting plug.

6. The housing of claim 5, wherein direction of motion of the bolt from the first position into the second position is a rotary motion or linearly inclined to the direction of motion of the external connecting plug being inserted into the opening.

7. The housing of claim 1, wherein, to open the housing, the first housing wall is swivel-mounted with respect to the housing or can be completely removed from the housing.

8. The housing of claim 5, wherein, to open the housing, the first housing wall is swivel-mounted with respect to the housing or can be completely removed from the housing.

9. The housing of claim 4, wherein, to open the housing, the first housing wall is swivel-mounted with respect to the housing or can be completely removed from the housing.

10. The computer system of claim 2, which is a thin client, an ail-in-one PC or a mini PC.

11. The computer system of claim 3, which is a thin client, an all-in-one PC or a mini PC.

12. The housing of claim 1, wherein in the first position the bolt projects with a first end into the opening for an external connecting plug and can be pressed into the second position upon contact with the external connecting plug.

13. The housing of claim 6, wherein, to open the housing, the first housing wall is swivel-mounted with respect to the housing or can be completely removed from the housing.

14. A housing for a computer system which can be opened at at least one first housing wall for access into the housing and an opening for an external connecting plug is disposed at a second housing wall and where 1) the housing has a locking device to lock the first housing wall and prevent opening of the housing, and 2) the locking device is disposed at the opening for an external connecting plug and is actuatable via an external connecting plug so that the first housing wall is locked when an external connecting plug is inserted into the opening and the first housing wall is unlocked if no external connecting plug is inserted into the opening; the locking device further comprises at least one bolt movable between a first position and a second position, where the bolt is out of engagement with the first housing wall in the first position and is in engagement with the first housing wall in the second position, wherein, to open the housing, the first housing wall is swivel-mounted with respect to the housing or can be completely removed from the housing.

* * * * *

UNITED STATES PATENT AND TRADEMARK OFFICE
CERTIFICATE OF CORRECTION

| | | |
|---|---|---|
| PATENT NO. | : 8,905,769 B2 | Page 1 of 1 |
| APPLICATION NO. | : 13/732508 | |
| DATED | : December 9, 2014 | |
| INVENTOR(S) | : Neukam | |

It is certified that error appears in the above-identified patent and that said Letters Patent is hereby corrected as shown below:

In the Claims,

In Column 8

At line 2, please change "ail-in-one" to -- all-in-one --.

Signed and Sealed this
Nineteenth Day of May, 2015

Michelle K. Lee
*Director of the United States Patent and Trademark Office*